(12) United States Patent
Chen

(10) Patent No.: US 10,043,650 B2
(45) Date of Patent: Aug. 7, 2018

(54) METHOD AND SYSTEM FOR WET CHEMICAL BATH PROCESS

(71) Applicant: Taiwan Semiconductor Manufacturing Co., Ltd., Hsinchu (TW)

(72) Inventor: Yung-Ho Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/272,876

(22) Filed: Sep. 22, 2016

(65) Prior Publication Data

US 2018/0082834 A1    Mar. 22, 2018

(51) Int. Cl.
*H01L 21/02* (2006.01)
*H01L 21/67* (2006.01)

(52) U.S. Cl.
CPC .. *H01L 21/02019* (2013.01); *H01L 21/67086* (2013.01)

(58) Field of Classification Search
CPC .............. H01L 21/02019; H01L 21/67086
See application file for complete search history.

(56) References Cited

U.S. PATENT DOCUMENTS

| | | | |
|---|---|---|---|
| 5,827,396 A * | 10/1998 | Ko | H01L 21/67075 156/345.23 |
| 6,788,477 B2 | 9/2004 | Lin | |
| 8,199,314 B2 | 6/2012 | Peng et al. | |
| 8,202,680 B2 | 6/2012 | Chang | |
| 8,208,116 B2 | 6/2012 | Lin et al. | |
| 8,253,922 B2 | 8/2012 | Lin et al. | |
| 8,264,662 B2 | 9/2012 | Chen et al. | |
| 8,383,322 B2 | 2/2013 | Chang et al. | |
| 8,415,091 B2 | 4/2013 | Chang | |
| 8,564,759 B2 | 10/2013 | Chang et al. | |
| 8,767,178 B2 | 7/2014 | Lin et al. | |
| 8,802,354 B2 | 8/2014 | Chang | |
| 8,841,058 B2 | 9/2014 | Chang | |
| 2005/0217793 A1* | 10/2005 | Hasegawa | B08B 3/10 156/345.18 |
| 2012/0034558 A1 | 2/2012 | Chang | |
| 2012/0045192 A1 | 2/2012 | Peng et al. | |
| 2012/0180823 A1 | 7/2012 | Peng et al. | |
| 2012/0236276 A1 | 9/2012 | Lin et al. | |
| 2012/0320351 A1 | 12/2012 | Lin et al. | |
| 2013/0216949 A1 | 8/2013 | Chang | |
| 2013/0309611 A1 | 11/2013 | Chang et al. | |
| 2014/0134759 A1 | 5/2014 | Lin et al. | |

* cited by examiner

*Primary Examiner* — Duy Vu N Deo
(74) *Attorney, Agent, or Firm* — McClure, Qualey & Rodack, LLP

(57) ABSTRACT

A method for performing a wet chemical process over a semiconductor wafer is provided. The method includes moving the semiconductor wafer into a chemical solution. The method further includes leaving the semiconductor wafer in the chemical solution for a processing time period. The method also includes turning the semiconductor wafer upside down while the wafer is in the chemical solution. Moreover, the method includes removing the semiconductor wafer from the chemical solution.

20 Claims, 10 Drawing Sheets

METHOD AND SYSTEM FOR WET CHEMICAL BATH PROCESS

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning or processing the substrate and/or the various material layers using lithography to form circuit components and elements thereon and form integrated circuits. Dozens or hundreds of integrated circuits are typically manufactured on a single semiconductor wafer. The individual dies are simulated by sawing the integrated circuits along a scribe line. The individual dies are then packaged separately, in multi-chip modules, or in other types of packaging, for example.

During the manufacturing of the semiconductor devices, various processing steps are used to fabricate integrated circuits on a semiconductor wafer. For example, semiconductor devices are formed on a semiconductor substrate using several wet chemical processing operations. The wet processing operations may include cleaning operations, stripping operations and etching operations in which the chemicals of a chemical bath react with a material being etched or removed.

Although existing devices and methods for wet chemical processing operations have been generally adequate for their intended purposes, they have not been entirely satisfactory in all respects. Consequently, it would be desirable to provide a solution for performing wet chemical processing operations.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
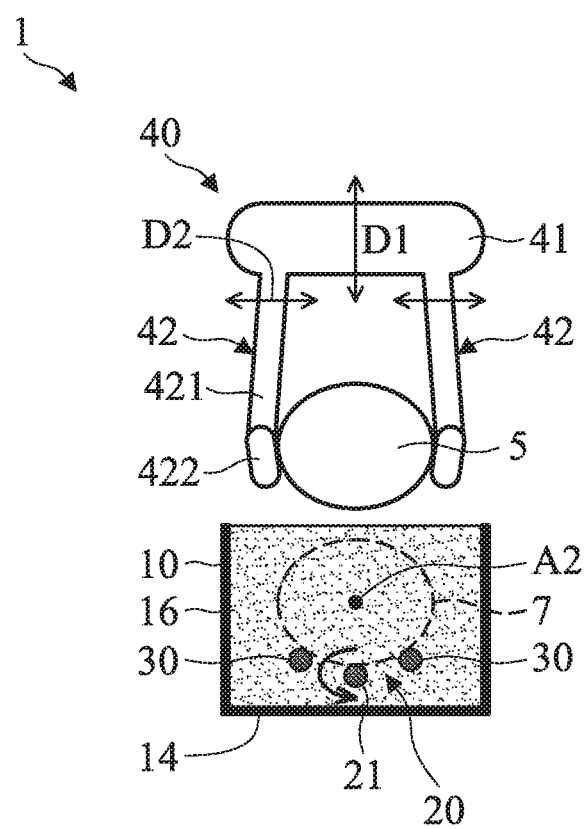
FIG. 1 is a schematic diagram of an apparatus for performing a wet chemical process, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIG. 1 shows a schematic diagram of an apparatus 1 for performing a wet chemical process over a semiconductor wafer 5, in accordance with some embodiments. In some embodiments, the apparatus 1 includes a processing tank 10, a driving module 20, two passive members 30, and a manipulating assembly 40. The elements of the apparatus 1 can be added to or omitted, and the invention should not be limited by the embodiment.

The semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

The processing tank 10 serves as the processing bath, i.e., the bath in which semiconductor wafers 5 are processed. In some embodiments, the processing tank 10 is formed by a bottom wall 14 and a sidewall 16 which is joined perpendicular to the bottom wall 14 forming a fluid-tight enclosure. The bottom wall 14 and the sidewall 16 can be constructed of a corrosion-resistant material such as panels of stainless steel or steel panels coated with a corrosion-resistant material such as Teflon.

In some embodiments, the processing tank 12 further includes a fluid dispensing member, or a spray bar positioned at the bottom of the tank for allowing a chemical solution to enter the tank. In some embodiments, one or more sensors may be mounted in the processing tank 10 to detect the presence of the semiconductor wafer 5, the operation of the driving module 20, or the characteristic of the chemical solution contained in the processing tank 12.

In one exemplary embodiment, the processing tank 10 may contain a chemical solution such as hot phosphoric acid. In one particular embodiment, the hot phosphoric acid, $H_3PO_3$, may be maintained at about 150° C. In other exemplary embodiments, the hot phosphoric acid in the processing tank 10 may be maintained at a temperature within a range of about 70° C. to about 160° C., or at other suitable temperatures. Various conventional heating members and techniques may be used to heat the $H_3PO_4$.

Figure 2:
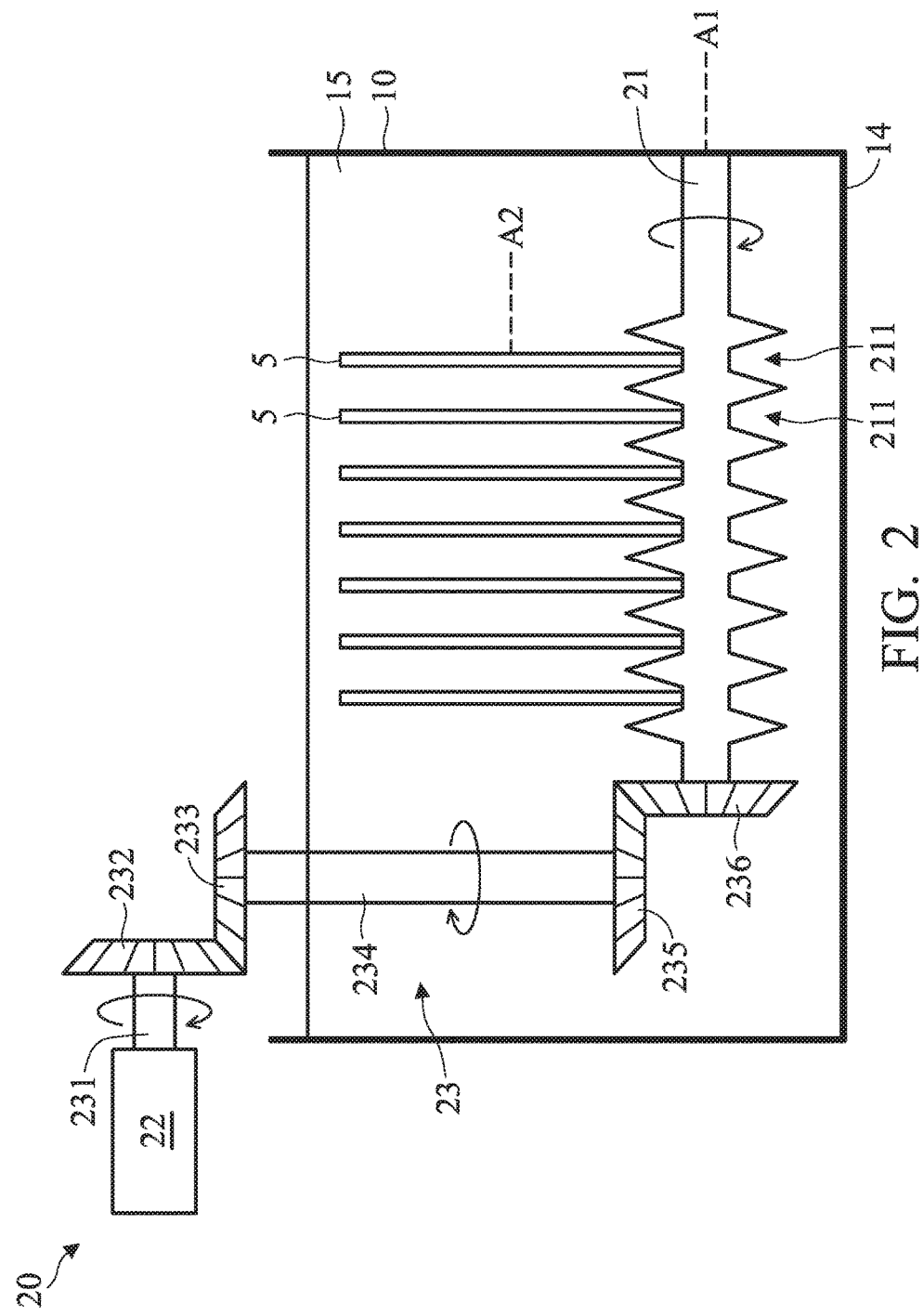
FIG. 2 shows a cross-section view of a portion of an apparatus for performing a wet chemical process, in accordance with some embodiments.

FIG. 2 shows a correctional view of a portion of the apparatus 1, in accordance with some embodiments. The driving module 20 is configured to change the orientation of the semiconductor wafer 5 positioned in the processing tank 10. In some embodiments, the driving module 20 includes an active member 21, an actuator 22, and a transmission assembly 23.

In some embodiments, the active member 21 is a shaft. The active member 21 is positioned in the processing tank 10. The active member 21 is spaced from the top of the processing tank 10 by a distance that is greater than the diameter of the semiconductor wafer 5, for example, 300 mm or 450 mm. As shown in FIG. 2, the active member 21 extends in a rotation axis A1 that is parallel to the bottom wall 14. The active member 21 may be constructed of a corrosion-resistant material such as Teflon.

In addition, a number of grooves 211 are defined on the active member 21. The grooves 211 surround the active member 21 and each has a width that corresponds to the thickness of the semiconductor wafer 5 that is to be positioned on the active member 21. In some embodiments, the width of each groove 21 gradually increases in a direction away from the rotation axis A1 for facilitating the receiving of the semiconductor wafer 5. In some embodiments, the active member 21 is capable of holding twenty-four semiconductor wafers 5.

The actuator 22 is configured to actuate the movement of the active member 21. The transmission assembly 23 connects the actuator 22 to the active member 21. In some embodiments, the transmission assembly 23 includes a first shaft 231, a second shaft 234 and a number of gears 232, 233, 235, and 236.

The first shaft 231 is connected to the actuator 22 and is driven to rotate by the actuator 22. The gear 232 is connected to one end of the first shaft 231. The gears 233 and 235 are respectively connected to two ends of the second shaft 234. The gear 236 is connected to one end of the active member 21. The gear 232 is meshed with the gear 233, and the gear 235 is meshed with the gear 236. When the actuator 22 is operated, the power from the actuator 22 is transmitted to the active member 21 via the transmission assembly 23.

In some embodiments, a portion of the transmission assembly 23 is immersed in the chemical solution 15 contained in the processing tank 10. For example, as shown in FIG. 2, the lower portion of second shaft 234, the gears 235 and 236 are immersed in the chemical solution 15 contained in the processing tank 10. To prevent these elements from becoming corroded, the gears 235 and 236 can be constructed of a corrosion-resistant material such as Teflon, and the second shaft 234 can be constructed of a corrosion-resistant material such as a rod of stainless steel.

In some embodiments, the active member 21 is a belt extending in a horizontal direction that is parallel to the bottom wall 14 of the processing tank 10. The belt is driven to move in the horizontal direction by the actuator 22 and a transmission assembly. The belt may be formed with a rugged surface so as to increase the friction force between the belt and the semiconductor wafer 5 and drive the semiconductor wafer 5 to rotate.

Figure 3:
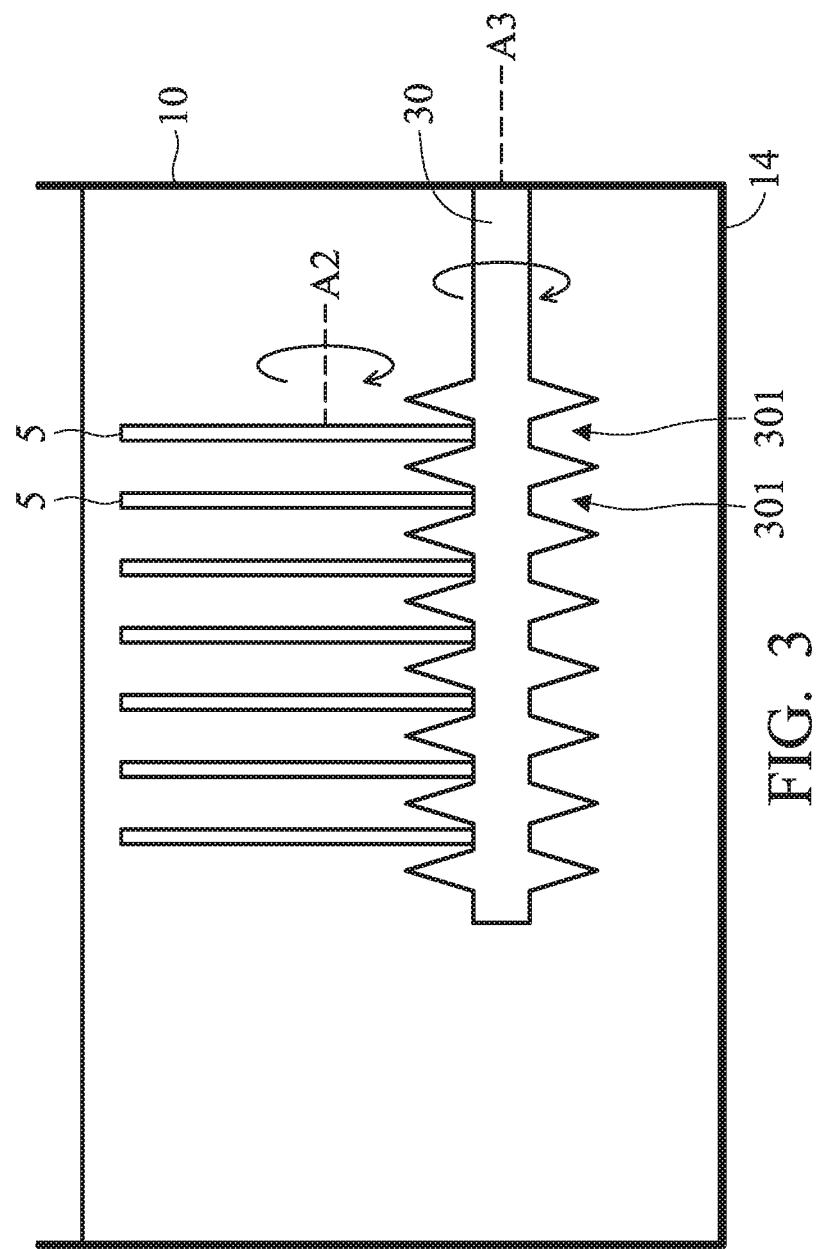
FIG. 3 shows a cross-section view of a portion of an apparatus for performing a wet chemical process, in accordance with some embodiments.

As shown in FIG. 1, the two passive members 30 are positioned in the processing tank 10. The two passive members 30 are positioned higher than the active member 21 and spaced apart from the bottom wall 14 of the processing tank 10 by the same distance. As shown in FIG. 3, in some embodiments, the passive members 30 are two shafts. One of the passive members 30 extends in a rotation axis A1 that is parallel to the bottom wall 14, and the other passive member 30 (not shown in FIG. 3) extends in a rotation axis that is parallel to the bottom wall 14 as well. The passive members 30 may be constructed of a corrosion-resistant material such as Teflon.

In some embodiments, a number of grooves 301 are defined on each passive member 30. The grooves 301 surround the passive members 30 and each has a width that corresponds to the thickness of the semiconductor wafer 5 that is to be positioned on the passive members 30. In some embodiments, the width of each groove 301 gradually increases in a direction away from the rotation axis A3 for facilitating the receiving of the semiconductor wafer 5. In some embodiments, the passive members 30 are capable of holding twenty-four semiconductor wafers 5. The number of grooves 301 corresponds to the number of grooves 211. In some other embodiments, there is no groove formed on the passive members 30. The passive member 30 has a smooth outer surface.

In some embodiments, as shown in FIG. 1, when viewed from a lateral direction that is parallel to the extension direction of the active member 21, the two passive members 30 and the active member 21 are arranged along the circumference of a circle 7. The circle 7 has a radius that is substantially equal to the radius of the semiconductor wafer 5 to be processed. In addition, an axis A2 passes through the center of the circle 7. As a result, all of the passive members 30 and the active member 21 are spaced from the axis A2 by the same distance.

The manipulating assembly 40 is configured for transporting the semiconductor wafer 5. For example, the manipulating assembly 40 transports the semiconductor wafer 5 to and from the processing tank 10 in a vertical direction D1. In some embodiments, the manipulating assembly 40 includes a base 41 and pairs of blades 42. Each pair of blades 42 are connected to the base 41 in such a manner that the two blades 42 are able to move toward or away from one another in the horizontal direction D2 so as to hold and position the semiconductor wafer 5.

In some embodiments, each of the blades 42 has an upper segment 421 and a lower segment 422. The upper segment 421 extends outwards and downwards relative to the vertical direction D1 from the base 41. The lower segment 422 extends inwards and downwards relative to the vertical direction D1 from the upper segment 421. An obtuse angle is formed between the upper segment 421 and the lower segment 422. The obtuse angle may be adjusted according to the semiconductor wafer 5 to be held by the manipulating assembly 40.

Figure 4:
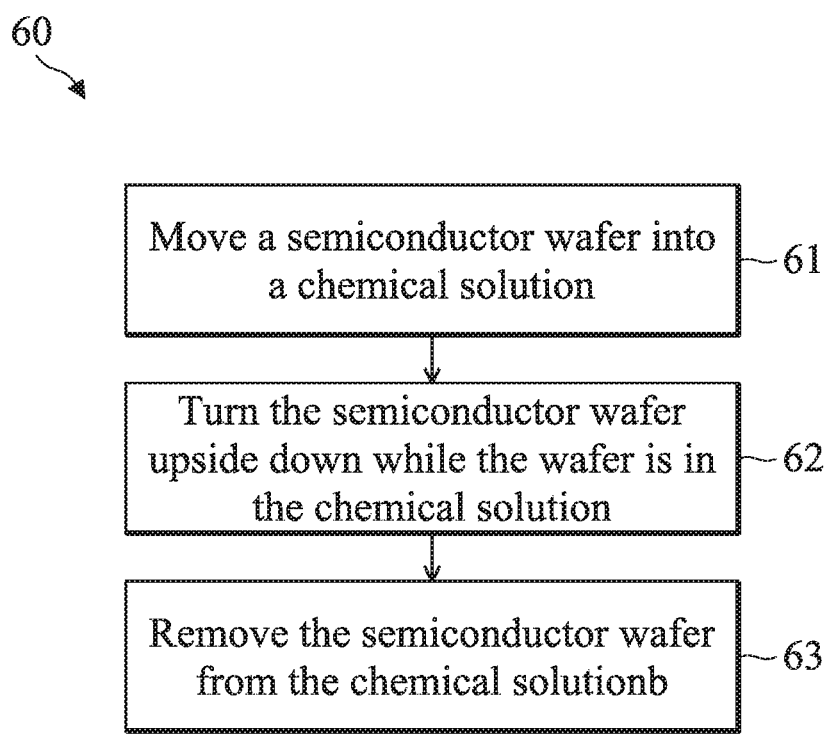
FIG. 4 shows a flow chart illustrating a method for performing a wet chemical process, in accordance with some embodiments

FIG. 4 is a flow chart illustrating a method 60 for performing a wet chemical process over a wafer, in accordance with some embodiments. For illustration, the flow chart will be described to accompany the cross-sectional view shown in FIGS. 5A-5E. Some of the described stages can be replaced or eliminated in different embodiments. Additional features can be added to the semiconductor device structure. Some of the features described below can be replaced or eliminated in different embodiments.

Figure 5A:
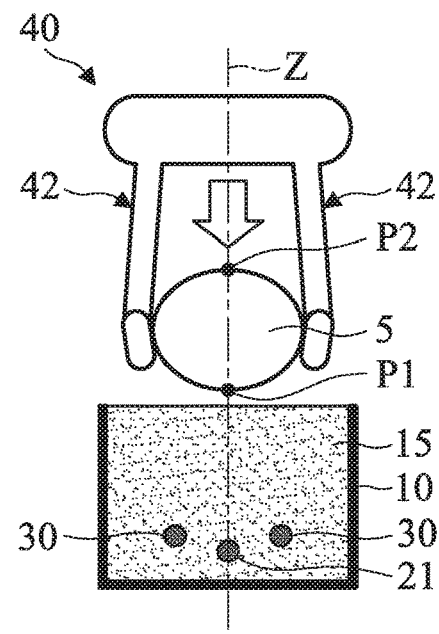
FIG. 5A shows a schematic view of one stage of a method for performing a wet chemical process as a wafer is being moved into a chemical solution, in accordance with some embodiments.

The method 60 begins with an operation 61, in which the semiconductor wafer 5 is moved into a chemical solution 15. In some embodiments, as shown in FIG. 5A, before the semiconductor wafer 5 enters the processing tank 10, the processing tank 10 is filled with the chemical solution 15. In addition, one or more than one semiconductor wafers 5 (only one semiconductor wafer 5 is shown in FIGS. 5A-5E) are transported by the manipulating assembly 40. Each semiconductor wafer 5 is securely held by two blades 42 of the manipulating assembly 40.

In some embodiments, when the manipulating assembly 40 is positioned above the processing tank 15, two reference points P1 and P2 that are defined in the outer boundary of the semiconductor wafer 5 are aligned with the active member 21 in a vertical axis Z. The first referent point P1 and the second referent point P2 are spaced apart from each other by an angle of approximately 180 degrees around the center of the semiconductor wafer 5.

Figure 5B:
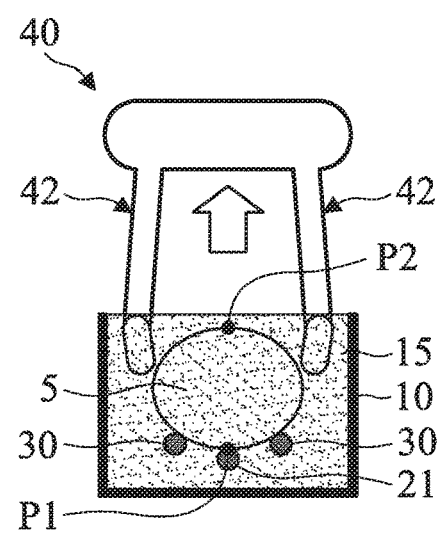
FIG. 5B shows a schematic view of one stage of a method for performing a wet chemical process as a wafer is in contact with an active member and passive members, in accordance with some embodiments.

Afterwards, as shown in FIG. 5B, the manipulating assembly 40 is lowered to bring the semiconductor wafer 5 into the chemical solution 15. During the downward movement of the manipulating assembly 40, the first referent point P1 go down into the chemical solution 15 first, and the second referent point P2 go down into the chemical solution 15 last.

The movement of the manipulating assembly 40 is stopped as the first reference point P1 is in contact with the active member 21. In some embodiments, when the semiconductor wafer 5 is in contact with the active member 21, the semiconductor wafer 5 is inserted into the grooves 211, as shown in FIG. 2. While at the same time, the semiconductor wafer 5 is inserted into the grooves 301 of the two passive members 30, as shown in FIG. 3. However, it should be appreciated that many variations and modifications can be made to embodiments of the disclosure. In the embodiments that there is no groove formed on the passive members 30, the semiconductor wafer 5 is abutted by the outer surface of the passive member 301.

In some embodiments, when the semiconductor wafer 5 is in contact with the active member 21, the manipulating assembly 40 is disengaged with the semiconductor wafer 5 is moved up into a position that is higher than the liquid surface. During the processing time period, the manipulating assembly 40 may be driven to transport another semiconductor wafer 5 to the processing tank 5 or other processing device. Alternatively, and manipulating assembly 40 may be idle during the processing time period.

Figure 5C:
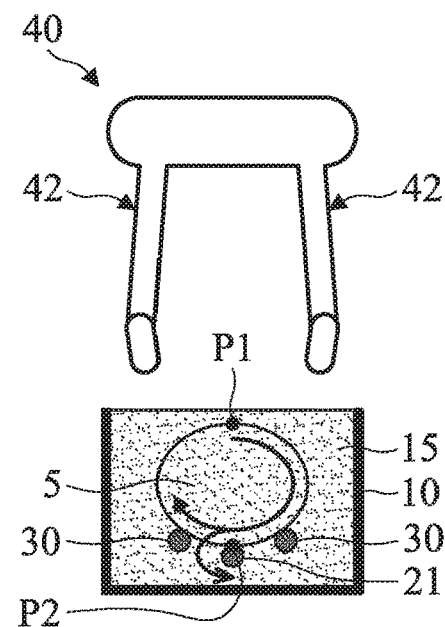
FIG. 5C shows a schematic view of one stage of a method for performing a wet chemical process as a wafer is being rotated by an active member, in accordance with some embodiments.

The method 60 continues with operation 62, in which the semiconductor wafer 5 is turned upside down in the chemical solution 15 by the movement of the active member 21. In some embodiments, as shown in FIG. 2, the active member 21 is driven to rotate by the power generated from the actuator 22. In addition, the active member 21 continuously makes contact with the outer boundary of the semiconductor wafer 5 while the active member 21 is rotated. As a result, as shown in FIG. 5C, the semiconductor wafer 5 is rotated by the friction force generated between the outer boundary of the semiconductor wafer 5 and the active member 21.

In some embodiments, the operation of rotating the semiconductor wafer 5 is stopped, if the active member 21 is in contact with the second reference point P2 of the semiconductor wafer 5. Since the first referent point P1 and the second referent point P2 are spaced apart from each other by an angle of approximately 180 degrees around the center of the semiconductor wafer 5, when the active member 21 is in contact with the second reference point P2, the semiconductor wafer 5 is turned upside down.

In some embodiments, the semiconductor wafer 5 is rotated about 180 degrees around an axis A2 that is perpendicular to the process surface of the semiconductor wafer 5. However, it should be appreciated that many variations and modifications can be made to embodiments of the disclosure. In some other embodiments, the semiconductor wafer 5 may be rotate by about 360*(n+½) degrees, wherein n is a natural number greater than or equal to 0. In some other embodiments, the semiconductor wafer 5 is rotated about 180 degrees around an axis that is parallel to the process surface of the semiconductor wafer 5 by a flipping machine.

Figure 5D:
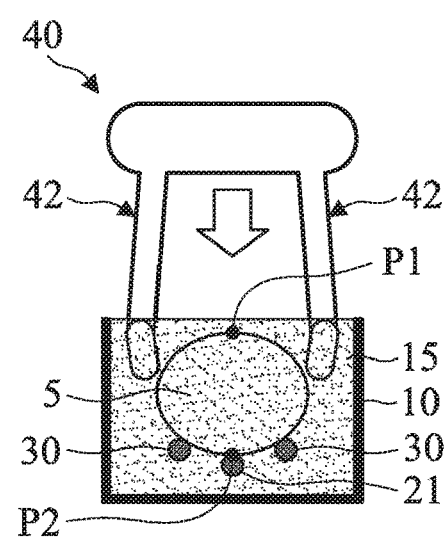
FIG. 5D shows a schematic view of one stage of a method for performing a wet chemical process as a manipulating assembly is being lowered to hold a wafer, in accordance with some embodiments.

The method 60 continues with operation 63, in which the semiconductor wafer 5 is removed from the chemical solution 15. In some embodiments, as shown in FIG. 5D, the manipulating assembly 40 is lowered to bring the semiconductor wafer 5 to leave the chemical solution 15. The downward movement of the manipulating assembly 40 may be initiated before the operation 62 is finished. Alternatively, downward movement of the manipulating assembly 40 may be initiated after the operation 62 is finished.

Figure 5E:
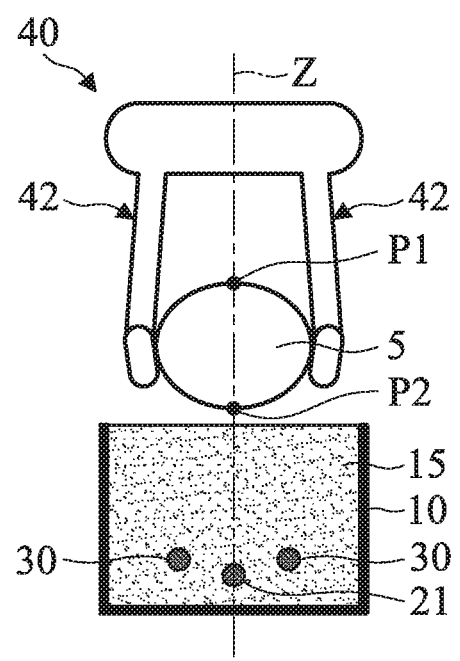
FIG. 5E shows a schematic view of one stage of a method for performing a wet chemical process as a wafer is being removed from a chemical solution, in accordance with some embodiments.

Afterwards, as shown in FIG. 5E, the semiconductor wafer 5 is held by the blades 42 of the manipulating assembly 40, and the manipulating assembly 40 is moved up to remove the semiconductor wafer 5 from the chemical solution 15. During the removal of the semiconductor wafer 5 from the chemical solution 15, the first referent point P1 leaves the chemical solution 15 first, and the second referent point P2 leaves the chemical solution 15 last. Therefore, the processing time for the top portion in the vicinity of the first reference point P1 and the bottom portion in the vicinity of the second reference point P2 is equalized and the processing quality (e.g. etching rate) becomes more uniform.

Figure 6A:
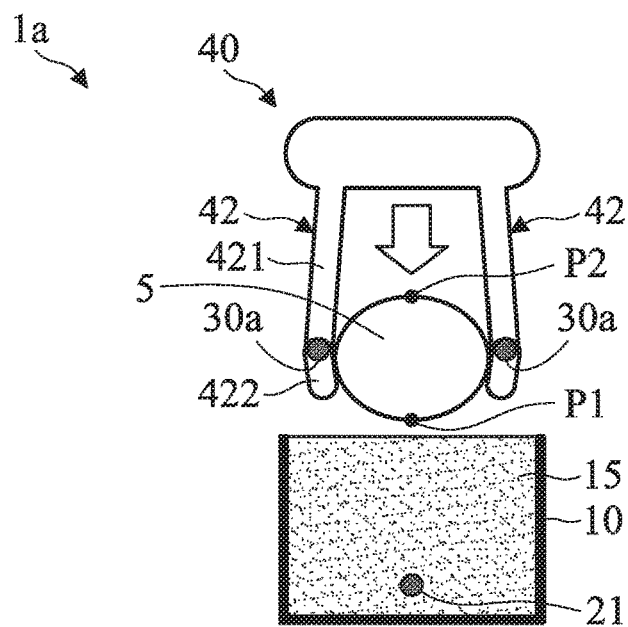
FIG. 6A shows a schematic view of one stage of a method for performing a wet chemical process as a wafer is being moved into a chemical solution, in accordance with some embodiments.

FIG. 6A shows a schematic diagram of an apparatus 1a for performing a wet chemical process over a semiconductor wafer 5, in accordance with some embodiments. In FIG. 6A, elements similar with that of the apparatus 1 shown in FIG. 1 are provided with the same reference numbers, and the features thereof are not reiterated in the interests of brevity. Differences between the apparatus 1 and the apparatus 1a include the two passive members 30 being replaced by two passive members 30a.

Figure 6B:
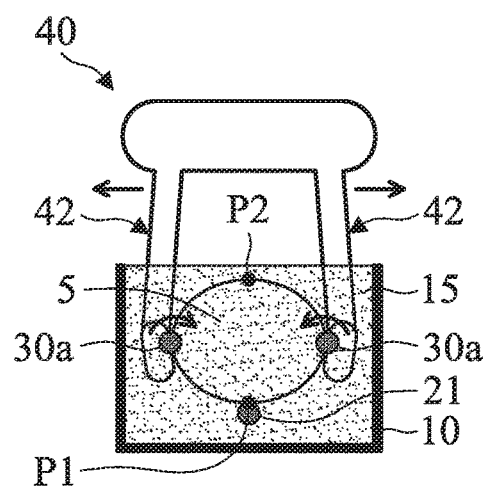
FIG. 6B shows a schematic view of one stage of a method for performing a wet chemical process as a wafer is in contact with an active member and passive members, in accordance with some embodiments.

In some embodiments, the two passive members 30a are two wheels respectively positioned on the two blades 42. Each wheel 30a is rotatably mounted on the intersection of the upper portion 421 and the lower portion 422 of the blade 42. In addition, the wheels 30a are connected to the blade 42 via a retracting mechanism (not shown in figures), such as a spring, so as to be moved into a retracted position (FIG. 6A) and an extended position (FIG. 6B).

In some embodiments, the method for processing the semiconductor wafer 5 by the use of the apparatus 1a is similar to the method shown in FIGS. 5A to 5E. Hereinafter, embodiments that are the same or similar as those previously described with reference to FIGS. 5A to 5E are not repeated for brevity.

In some embodiments, as shown in FIG. 6A, before the semiconductor wafer 5 is immersed into the chemical solution 15, the semiconductor wafer 5 is held by the blades 42, and the wheels 30a are in a retracted position. Afterwards, as shown in FIG. 6B, when the manipulating assembly 40 is lowered and brings the semiconductor wafer 5 into contact with the active member 21, the blades 42 of the manipulating assembly 40 are moved outward. At this moment, the wheels 30a are slid out by the retracting mechanism (not shown in figures) and moved into the extended position, and the semiconductor wafer 5 is held by the wheels 30a.

Figure 6C:
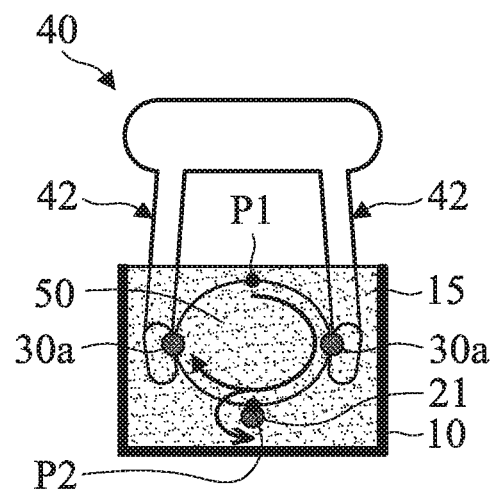
FIG. 6C shows a schematic view of one stage of a method for performing a wet chemical process as a wafer is being rotated by an active member, in accordance with some embodiments.
Figure 6D:
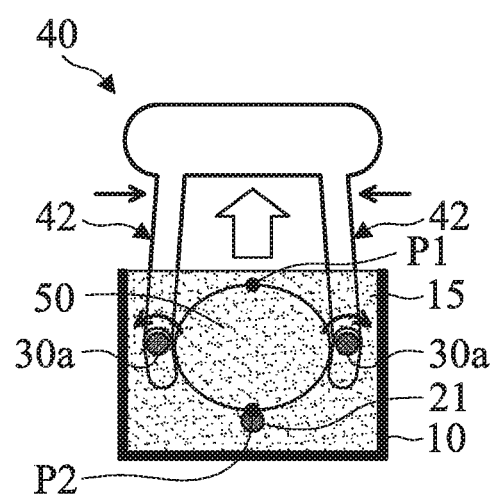
FIG. 6D shows a schematic view of one stage of a method for performing a wet chemical process as a manipulating assembly is being lowered to hold a wafer, in accordance with some embodiments.
Figure 6E:
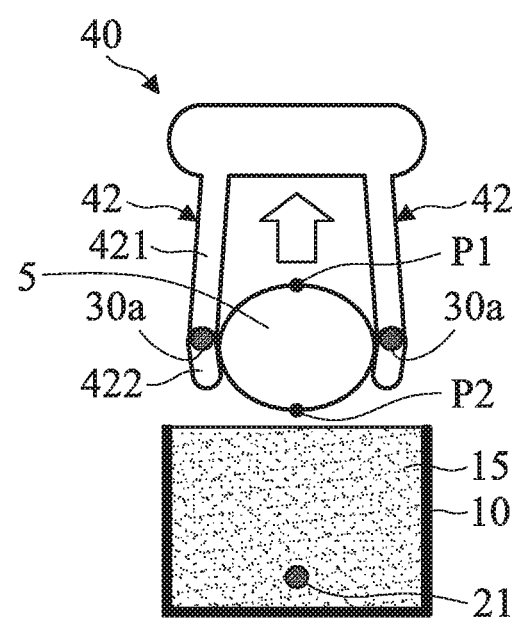
FIG. 6E shows a schematic view of one stage of a method for performing a wet chemical process as a wafer is being removed from a chemical solution, in accordance with some embodiments.

Afterwards, as shown in FIG. 6C, when the semiconductor wafer 5 is rotated by the active member 21, the semiconductor wafer 5 is kept in position by the wheel 30a, and the wheels 30a are driven to rotate by the semiconductor wafer 5. Afterwards, as shown in FIG. 6D, after the semiconductor wafer 5 is turned upside down, the blades 42 of the manipulating assembly 40 are moved inward, and the wheels 30a are moved into the retracted position, and the semiconductor wafer 5 is held by the blades 42 again. Afterwards, the semiconductor wafer 5 is moved up by the manipulating assembly 40 to leave the chemical solution 15, as shown in FIG. 6E.

Embodiments of performing a wet chemical process over a semiconductor wafer are provided. The semiconductor wafer in the chemical solution is rotated to change its orientation. Therefore, when the semiconductor wafer is moved out of the chemical solution, the bottom portion of the semiconductor wafer that entered the chemical solution first leaves it first, whereas the top portion that entered the chemical solution last leaves it last. As a result, the upper portion and the lower portion are processed in approximately the same time period, and process uniformity in different locations of the semiconductor wafer is improved.

According to some embodiments, a method for performing a wet chemical process over a semiconductor wafer is provided. The semiconductor wafer has a first and a second reference point that are located on the outer boundary of the semiconductor wafer. The method includes immersing a wafer into a chemical solution in a processing tank. The method further includes creating a contact between the first reference point of the semiconductor wafer and an active member that is positioned in the processing tank. The method also includes moving the active member to drive the semiconductor wafer to rotate. The movement of the active member is stopped if the active member is in contact with the second reference point of the semiconductor wafer. In addition, the method includes removing the semiconductor wafer from the chemical solution.

According to some embodiments, a method for performing a wet chemical process over a semiconductor wafer is provided. The method includes moving the semiconductor wafer into a chemical solution by a manipulating assembly. The method further includes leaving the semiconductor wafer in the chemical solution for a processing time period and holding the semiconductor wafer by the manipulating assembly during the processing time. The method also includes turning the semiconductor wafer upside down while the semiconductor wafer is in the chemical solution. In addition, the method includes removing the semiconductor wafer from the chemical solution.

According to some embodiments, an apparatus for performing a wet chemical process over at least one semiconductor wafer is provided. The apparatus includes a processing tank configured for containing a chemical solution. The apparatus further includes a manipulating assembly configured for transporting the semiconductor wafer. The apparatus also includes an active member positioned in the processing tank and arranged being rotatable. In addition, the apparatus includes two passive members positioned on the manipulating assembly or positioned in the processing tank. The active member and the two passive members are positioned at the same plane and configured to facilitate a rotation of the semiconductor wafer.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for performing a wet chemical process over a semiconductor wafer having a first and a second reference point that are located on the outer boundary of the semiconductor wafer, comprising:
   immersing the semiconductor wafer into a chemical solution in a processing tank;
   creating a contact between the first reference point of the semiconductor wafer and an active member that is positioned in the processing tank;
   moving the active member to drive the semiconductor wafer to rotate and stopping the moving of the active member when the active member is in contact with the second reference point of the semiconductor wafer;
   creating contacts between the outer boundary of the semiconductor wafer and two passive members;
   driving the two passive members to rotate by the rotation of the semiconductor wafer; and
   removing the semiconductor wafer from the chemical solution.

2. The semiconductor device package as claimed in claim 1, wherein the first reference point and the second reference point are spaced apart from each other by an angle of approximately 180 degrees around the center of the semiconductor wafer.

3. The method as claimed in claim 1, wherein while the semiconductor wafer is being rotated, the active member continuously makes contact with the outer boundary of the semiconductor wafer along a path extending from the first reference point and the second reference point.

4. The method as claimed in claim 1, wherein a manipulating assembly is used to perform the operation of immersing the semiconductor wafer into the chemical solution and the operation of removing the semiconductor wafer from the chemical solution, and the semiconductor wafer is held by the manipulating assembly while the semiconductor wafer is being rotated.

5. The method as claimed in claim 1, wherein the semiconductor wafer is rotated by a friction force generated between the outer boundary of the semiconductor wafer and the active member.

6. The method as claimed in claim 1, wherein the active member is rotated about a first axis that is perpendicular to a process surface of the semiconductor wafer.

7. The method as claimed in claim 1, wherein the chemical solution comprises an etchant solution.

8. The method as claimed in claim 1, wherein the semiconductor wafer is immersed into the chemical solution by a manipulating assembly, and the method further comprises:
   holding the semiconductor wafer by two blades of the manipulating assembly;
   lowering the manipulating assembly to create an contact between the semiconductor wafer and the active member; and
   moving the two blades outward so as to allow the two passive members sliding out from the two blades to hold the semiconductor wafer.

9. The method as claimed in claim 1, wherein the semiconductor wafer is in direct contact with a groove formed on the active member.

10. The method as claimed in claim 1, wherein while the semiconductor wafer is being rotated, the two passive members are rotatable about rotation axes that are perpendicular to a process surface of the semiconductor wafer.

11. A method for performing a wet chemical process over a semiconductor wafer, comprising:
    moving the semiconductor wafer into a chemical solution by a manipulating assembly;
    leaving the semiconductor wafer in the chemical solution for a processing time period and holding the semiconductor wafer by two passive members that are rotatably positioned on the manipulating assembly during the processing time period;
    turning the semiconductor wafer upside down before the end of the processing time period, wherein the two passive members are driven to rotate by the semiconductor wafer during the rotation of the processing time period; and
    removing the semiconductor wafer from the chemical solution.

12. The method as claimed in claim 11, wherein turning the semiconductor wafer upside down comprises rotating the semiconductor wafer by about $360*(n+½)$ degrees, wherein n is a natural number greater than or equal to 0.

13. The method as claimed in claim 11, wherein turning the semiconductor wafer upside down comprises rotating the semiconductor wafer about an axis that is perpendicular to a process surface of the semiconductor wafer.

14. The method as claimed in claim 11, wherein turning the semiconductor wafer upside down comprises:
    creating a contact between the semiconductor wafer and an active member that is positioned in the processing tank; and
    moving the active member to drive the semiconductor wafer to rotate, wherein while the semiconductor wafer is being rotated, the active member continuously makes contact with the semiconductor wafer.

15. The method as claimed in claim 14, wherein the semiconductor wafer is in direct contact with a groove formed on the active member.

16. The method as claimed in claim 11, wherein the chemical solution comprises an etchant solution.

17. The method as claimed in claim 11, wherein the operation of moving the semiconductor wafer into a chemical solution by a manipulating assembly comprises:
    holding the semiconductor wafer by two blades of the manipulating assembly;
    lowering the manipulating assembly to create an contact between the semiconductor wafer and an active member located in the chemical solution; and
    moving the two blades outward so as to allow the two passive members sliding out from the two blades to hold the semiconductor wafer.

18. The method as claimed in claim 11, wherein while the semiconductor wafer is being rotated, the two passive members are rotatable about rotation axes that are perpendicular to a process surface of the semiconductor wafer.

19. A method for performing a wet chemical process over a semiconductor wafer, comprising:
    placing the semiconductor wafer into a chemical solution;
    creating a contact between the semiconductor wafer and an active member that is located in the chemical solution;

moving the active member to drive the semiconductor wafer to rotate;

creating contacts between the semiconductor wafer and two passive members, wherein the active member and the two passive members are arranged along the circumference of a circle when the semiconductor wafer is driven to rotate; and driving the two passive members to rotate by the rotation of the semiconductor wafer.

20. The method as claimed in claim 19, wherein the semiconductor wafer is placed into the chemical solution by a manipulating assembly, and the two passive members are rotatably positioned on the manipulating assembly.

* * * * *